(12) United States Patent
Groenhuis et al.

(10) Patent No.: US 10,109,564 B2
(45) Date of Patent: Oct. 23, 2018

(54) WAFER LEVEL CHIP SCALE SEMICONDUCTOR PACKAGE

(71) Applicant: NXP B.V., Eindhoven (NL)

(72) Inventors: Roelf Groenhuis, Nijmegen (NL); Leo Van Gemert, Nijmegen (NL); Tonny Kamphuis, Lent (NL); Jan Gulpen, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/431,124

(22) Filed: Feb. 13, 2017

(65) Prior Publication Data

US 2017/0372988 A1 Dec. 28, 2017

(30) Foreign Application Priority Data

Jun. 23, 2016 (EP) .................................... 16175983

(51) Int. Cl.
*H01L 23/495* (2006.01)
*H01L 21/48* (2006.01)
(Continued)

(52) U.S. Cl.
CPC .... *H01L 23/49572* (2013.01); *H01L 21/4825* (2013.01); *H01L 21/561* (2013.01); *H01L 21/565* (2013.01); *H01L 21/568* (2013.01); *H01L 23/3114* (2013.01); *H01L 23/3142* (2013.01); *H01L 23/4952* (2013.01); *H01L 23/49582* (2013.01); *H01L 24/96* (2013.01); *H01L 24/13* (2013.01); *H01L 24/16* (2013.01); *H01L 24/48* (2013.01); *H01L 24/49* (2013.01); *H01L 24/81* (2013.01); *H01L 24/85* (2013.01); *H01L 2224/131* (2013.01); *H01L 2224/16245* (2013.01); *H01L 2224/48091* (2013.01);
(Continued)

(58) Field of Classification Search
CPC ....... H01L 33/62; H01L 33/54; H01L 33/502; H01L 33/486
See application file for complete search history.

(56) References Cited

U.S. PATENT DOCUMENTS 5,487,999 A * 1/1996 Farnworth ........... G01R 1/0466
216/18
9,607,723 B2 * 3/2017 Sipila ....................... G21K 1/00
(Continued)

FOREIGN PATENT DOCUMENTS

JP    2006080576 A    3/2006

OTHER PUBLICATIONS

Extended European Search Report dated Nov. 11, 2016 in EP Application No. 16175983.2.
(Continued)

*Primary Examiner* — Dung Le (57) ABSTRACT

This disclosure relates to a method of forming a wafer level chip scale semiconductor package, the method comprising: providing a carrier having a cavity formed therein; forming electrical contacts at a base portion and sidewalls portions of the cavity; placing a semiconductor die in the base of the cavity; connecting bond pads of the semiconductor die to the electrical contacts; encapsulating the semiconductor die; and removing the carrier to expose the electrical contacts, such that the electrical contacts are arranged directly on the encapsulation material.

20 Claims, 5 Drawing Sheets

(51) Int. Cl.
*H01L 21/56* (2006.01)
*H01L 23/31* (2006.01)
*H01L 23/00* (2006.01)

(52) U.S. Cl.
CPC ............... *H01L 2224/48247* (2013.01); *H01L 2224/48257* (2013.01); *H01L 2224/48465* (2013.01); *H01L 2224/49171* (2013.01); *H01L 2224/81203* (2013.01); *H01L 2224/81439* (2013.01); *H01L 2224/81444* (2013.01); *H01L 2224/81447* (2013.01); *H01L 2224/81815* (2013.01); *H01L 2224/85439* (2013.01); *H01L 2224/85444* (2013.01); *H01L 2224/85447* (2013.01); *H01L 2924/1815* (2013.01); *H01L 2924/18165* (2013.01); *H01L 2924/18301* (2013.01); *H01L 2924/386* (2013.01)

(56) References Cited

U.S. PATENT DOCUMENTS

| | | |
|---|---|---|
| 2003/0197828 A1* | 10/2003 | Ha .................... G02F 1/136286 349/158 |
| 2006/0081967 A1 | 4/2006 | Ha et al. |
| 2012/0241966 A1 | 9/2012 | Camacho et al. |
| 2013/0037830 A1* | 2/2013 | Jang ........................ H01L 33/60 257/88 |
| 2016/0093783 A1 | 3/2016 | Singer et al. |

OTHER PUBLICATIONS

"Customised Lead Frame," downloaded on Feb. 18, 2016 from <<http://mtarr.co.uk/courses/topics/0264_csp/supplementary/sup_01.html>>; 11 pages.

* cited by examiner

Cross section A-A'

WAFER LEVEL CHIP SCALE SEMICONDUCTOR PACKAGE

CROSS-REFERENCE TO RELATED APPLICATIONS

This application claims the priority under 35 U.S.C. § 119 of European Patent application no. 16175983.2, filed on 23 Jun. 2016, the contents of which are incorporated by reference herein.

FIELD

The present disclosure relates to a wafer level chip scale semiconductor package and a method of forming a wafer level chip scale semiconductor package.

BACKGROUND

The ongoing trend to miniaturise semiconductor devices has led to the need to miniaturise device packages without affecting the electrical performance of the device. Such devices should have minimal area, or footprint, and height enabling them to be mounted on carriers such as PCBs (Printed Circuit Boards) with limited area and headroom.

SUMMARY

An embodiment relates to a method of forming a wafer level chip scale semiconductor package, the method comprising: providing a carrier having a cavity formed therein; forming electrical contacts at a base portion and sidewalls portions of the cavity; placing a semiconductor die in the base of the cavity; connecting bond pads of the semiconductor die to the electrical contacts; encapsulating the semiconductor die; and removing the carrier to expose the electrical contacts, such that the electrical contacts are arranged directly on the encapsulation material.

In an embodiment the carrier may be removed by etching. The electrical contacts may be formed by plating the base and the sidewalls of the cavity. Forming the electrical contacts may further comprise plating an upper major surface of the carrier. The electrical contacts may be formed by a rough plating process. The electrical contacts may comprise nickel. The electrical contacts may form the terminals of the wafer level chip scale semiconductor package.

An embodiment also relates to a wafer level chip scale semiconductor package comprising: a semiconductor die encapsulated in an encapsulation material, said encapsulation having side walls and base; a plurality of electrical contacts, wherein each of the plurality of electrical contacts are arranged directly on the encapsulation material; bond pads of the semiconductor die are connected to respective electrical contacts, wherein said each of said electrical contacts extend from a base portion to a side wall portion of the encapsulation material.

The electrical contact may be rough plated. The electrical contacts may comprise nickel. The electrical contacts may form the terminals wafer level chip scale semiconductor package.

DESCRIPTION OF THE DRAWINGS

Embodiments are described further hereinafter by way of example only with reference to the accompanying drawings in which.

In the figures and the following description like reference numerals refer to like features.

DETAILED DESCRIPTION

Figure 1A:
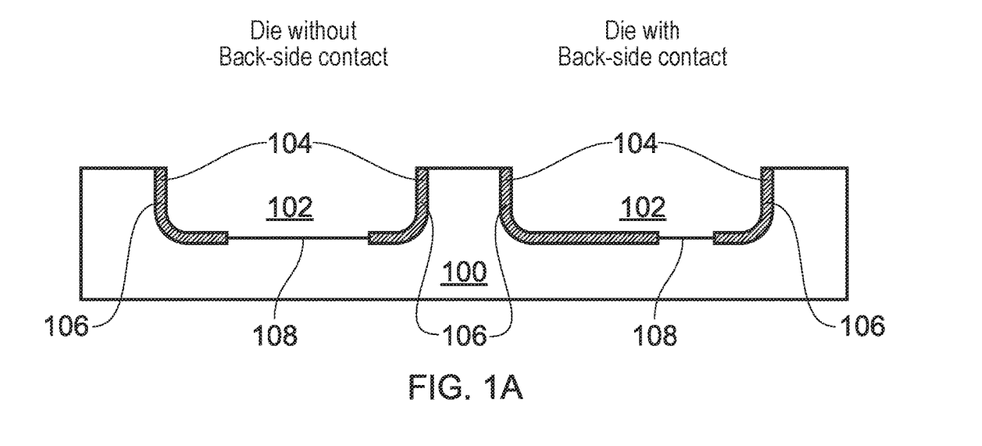
FIG. 1A illustrates a cross-sectional view of a carrier with cavities and electrical contacts formed in the cavities.

FIGS. 1A to 1F illustrate various stages of the manufacture of a wafer level chip scale semiconductor package according to embodiments. FIG. 1A shows a carrier 100 having one or more cavities 102 formed therein. The carrier may be a lead frame suitable for mounting a semiconductor die thereon. The carrier may be formed of any appropriate material such as metals or plastics. In the case of plastics the carriers may be formed of a metalised plastic. In the case of metals the carrier may be formed of for example copper or aluminium. In either case the carrier material should be such that it can withstand, that is not deform during the moulding process (discussed below) where moulding temperatures in the order of approximately 180 degrees Celsius are required to mould the package. In addition the carrier material may be capable of being selectively etched such that the carrier material can be etched without removing any surrounding material, such as the electrical contacts or encapsulant (both discussed below). The cavities 102 may be formed mechanically by stamping or by etching the carrier 100. Each cavity 102 may be have at least a pair of opposing side walls 106 separated by a base 108. Typically a depth of the cavities 102

(that is the vertical length of the side walls 106) may be deeper than the height of a semiconductor die to be placed therein. Alternatively, the die may sit above or in line with the height of the cavity. The cavities 102 may be deeper than the combined height of the semiconductor die and any contacts, such as bond pads, bond wires or solder bumps formed on the die. Whilst FIG. 1A illustrates two cavities 102 formed in the carrier 100, the skilled person will appreciate that any number of cavities may be formed in the carrier as required and without departing from the scope of the present disclosure. Furthermore, the skilled person will understand that the cavities 102 may be arranged as a grid or a two-dimensional matrix on the carrier 100 and may later be singulated as discussed in more detail below with respect to FIGS. 1E and 4E.

Following formation of the cavities 102 in the carrier 100, electrical contacts 104 may then be formed in the cavities 102. The electrical contacts 104 may be formed by local plating of a contact metal in the cavities 102. The plating process may be a lithographic process with appropriate masks to define the electrical contact geometry. Alternatively, the electrical contact geometry may be defined by laser ablation of the contact metal following full plating of the side walls and base of the cavity. Dependent on the metal or alloy material used the process of forming the electrical contacts 104 is entirely at the choice of the skilled person provided that the electrical contacts are capable of solder wetting and are resistant to etching during the carrier etching process discussed below. The electrical contact metal or alloy material may be a nickel based metal or alloy such as AuNiAu or alternatively AuPdNiPdAu. Other metals such as Ag or Cu may also be used.

The electrical contacts 104 may be formed such that they extend either partially or fully up the side walls 106 of the cavities 102 and extend partially along the base 108 of the cavities 102. Alternatively, the electrical contacts 104 may not extend up the side walls 106 of the cavities 102 and extend only partially along the base 108. Alternatively the electrical contacts 104 may be formed such that they extend either partially or fully up the side walls 106 of the cavities 102 and do not extend along the full length of the base.

Preferably, the contacts on opposing sidewalls and/or contacts extending along the base of any one cavity should not be connected. In the case of a two terminal semiconductor die, this would cause a short circuit of the device rendering it inoperable.

Following formation of the electrical contacts 104, and prior to placement of the semiconductor dies, bonding of the electrical connections and encapsulation it may be necessary to mechanically roughen the surface of the electrical contacts 114 so that the encapsulant 114 adheres thereto. Alternatively, the electrical contacts may be deposited so as to have a rough surface. This may be achieved by roughening the carrier prior to plating or simply depositing a rough electrical contact. Rough electrical contacts may be defined as having a surface roughness topography or surface area ratio (SAR) in the region of 1 μm. SAR is the increase in three dimensional roughness relative to the two dimensional area. Having a rough electrical contact ensures that there is good mechanical adhesion between the electrical contact and the encapsulant.

Figure 1B:
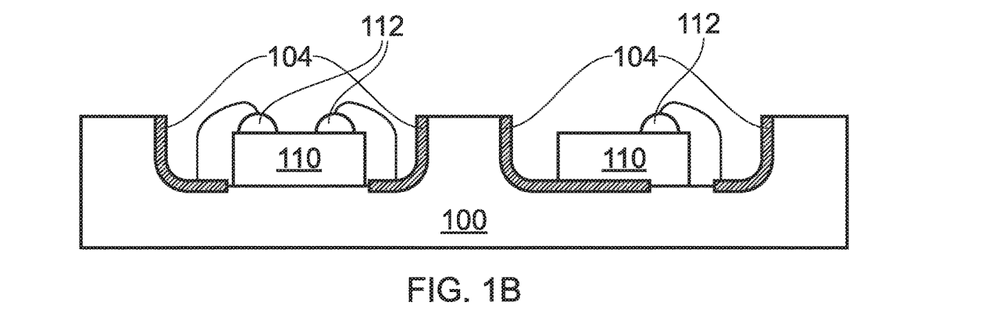
FIG. 1B illustrates a cross-sectional view of a carrier with semiconductor dies arranged in the cavities.

Following formation of the electrical contacts 104 in the cavities 100, semiconductor dies 110 are placed in each of the cavities 102 as illustrated in FIG. 1B. Each of the semiconductor dies 110 may be attached to the carrier 100 by any appropriate means, such as a die attach adhesive. In the case of the arrangement on the left-hand side of FIG. 1B, the semiconductor die 110 is placed directly onto the carrier 100 using an appropriate die attach method. Bond pads (not illustrated) on a top surface of the semiconductor die 110 may then be wire bonded to the electrical contacts 104 formed on the base of the cavity 102 to form electrical connections 112 from the semiconductor dies 110 to the electrical contacts 104. In the case of the arrangement on the right-hand side of FIG. 1B, the semiconductor die 110 is placed partially on the carrier 100 and partially on the one of the electrical contacts 104 in the base of the cavity 102. In this arrangement the semiconductor die 110 may comprise so-called top side and back side contacts on opposing major surfaces of the semiconductor die 110. In this case, the back side contact is attached to one of the electrical contacts 104 using an appropriate die attach material, whereas the top side contact may be attached to another of the electrical contacts 104 using an appropriate wire bond method, such as the method used in the left-hand side arrangement of FIG. 1B.

Figure 1C:
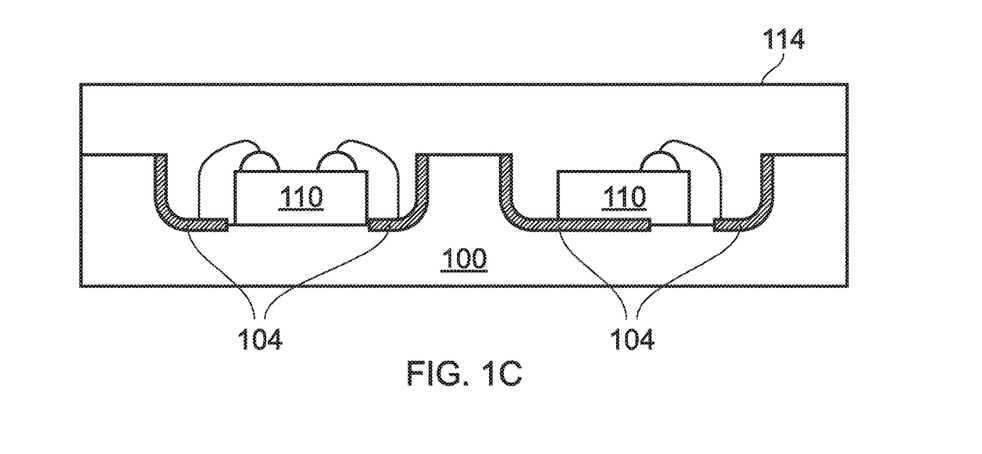
FIG. 1C illustrates a cross-sectional view of a carrier with encapsulated semiconductor dies arranged in the cavities.

Following placement and electrical connection of the semiconductor dies 110 in the cavity 102, an encapsulant 114 may be deposited over the carrier 100, as illustrated in FIG. 1C so as to fill the cavity 102 with encapsulant and cover the semiconductor dies 110 and electrical connections 112. The deposition of encapsulant 114 may be an over moulding process for example. Following encapsulation, any excess encapsulant 114 may be removed by grinding back encapsulant as required to achieve the appropriate wafer level chip scale semiconductor package height. The encapsulant may optionally be ground back until the carrier at the top of the cavity is exposed.

Figure 1D:
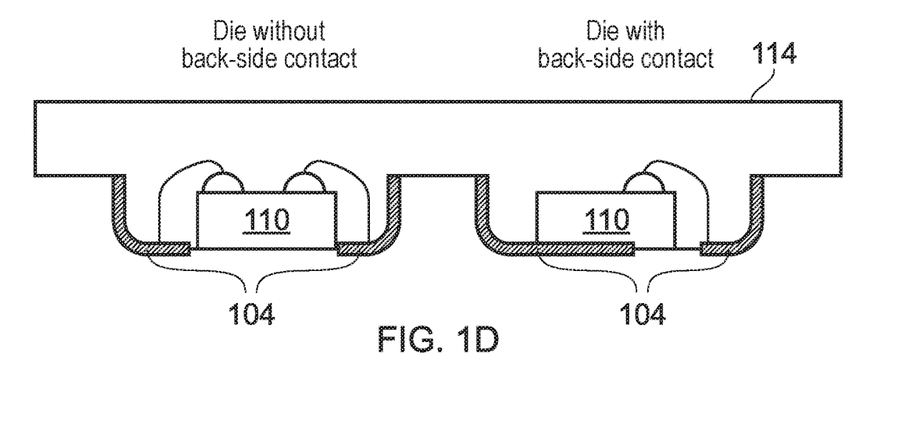
FIG. 1D illustrates a cross-sectional view of encapsulated semiconductor dies, with the carrier removed.
Figure 1E:
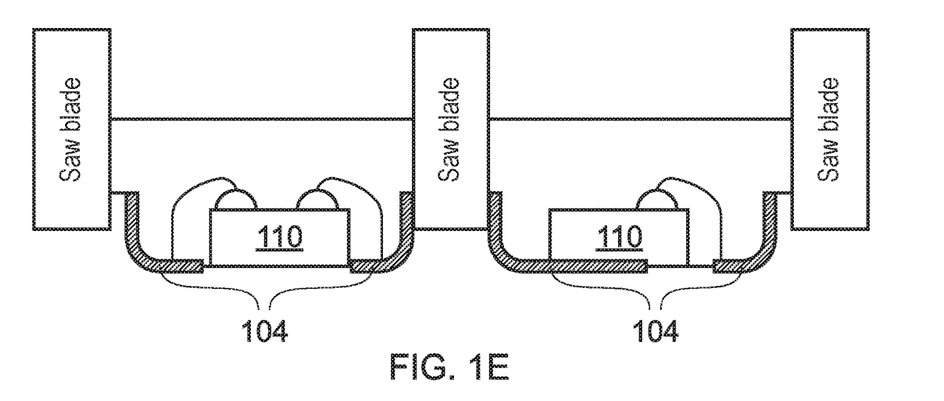
FIG. 1E illustrates a cross-sectional view of encapsulated semiconductor dies being singulated.

Following the encapsulation and optional grinding, the carrier 100 may be removed as illustrated in FIG. 1D. For example the carrier 110 may be removed by any appropriate etching process such as wet etching, anisotropic, wet etching or plasma etching. In this way the carrier 110 may be seen as a sacrificial carrier. Removal of the carrier 110 thus exposes the electrical contacts 104 which are ultimately contact terminals of the final wafer level chip scale semiconductor package illustrated in FIG. 1F. Processing in this way achieves wafer level chip scale semiconductor package without a carrier or leadframe, thus reducing overall package height. In addition to reduced package height because of the removal of the carrier, the electrical contacts 104 form a side wall wettable terminal portion connected and contiguous with base terminal portion on the wafer level chip scale semiconductor package. The side wall terminal portion may be capable of visual inspection when the package is soldered or mounted on for example a PCB, whereas the base terminal portion may be obscured. In this regard the side terminals are visible after mounting. Without the side wettable terminals visual inspection is difficult because the terminals will be obscured by the device itself. In this way quality control inspections of mounted devices can be simplified. Furthermore, because of the moulding process, the semiconductor die will be encapsulated and thus better protected from environmental conditions, unlike traditional wafer level chip-scale packages.

Figure 1F:
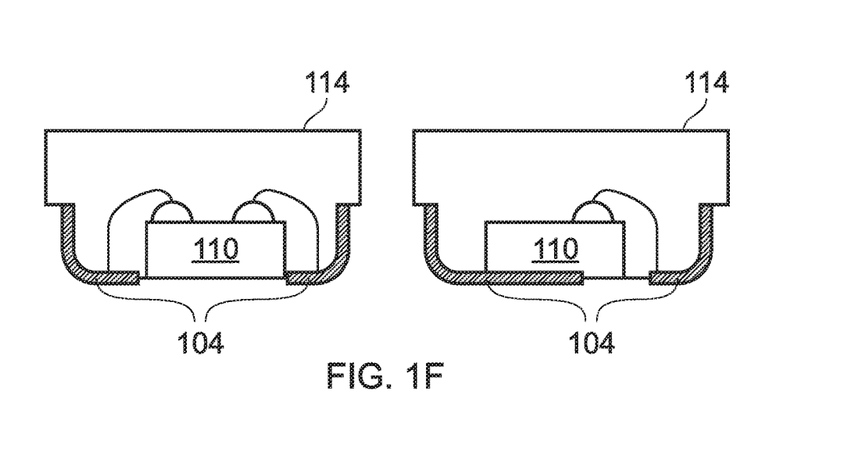
FIG. 1F illustrates a cross-sectional view of a wafer level chip scale semiconductor package according to an embodiment.

After removal of the carrier, individual wafer level chip scale semiconductor packages may be singulated by sawing or plasma dicing through the encapsulation layer thus arriving at individual packages as illustrated in FIG. 1F.

Figure 2A:
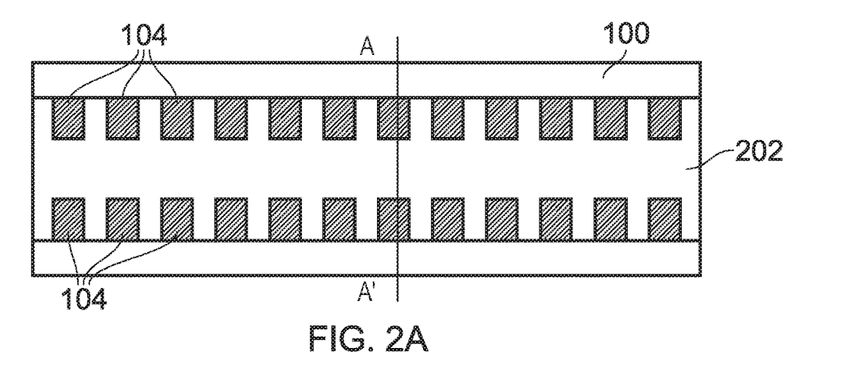
FIG. 2A illustrates a plan view of a carrier with an elongate cavity and electrical contacts formed in the cavity.

The carrier 100 may be arranged such that the cavities are formed as a two-dimensional matrix in the carrier. Alternatively and with reference to FIGS. 2A to 2C the carrier may be arranged such that an elongate cavity 202 is formed in the carrier 100, where one or more semiconductor dies 110 are capable of being placed in the cavity. FIG. 2A shows an elongate cavity 202 or channel formed in the carrier 100. FIG. 2D is a cross-section taken through line A-A' of FIG. 2A. As with the arrangement of FIGS. 1A to 1F described above, electrical contacts 104 may be formed along the length of the elongate cavity by any appropriate method.

Figure 2B:
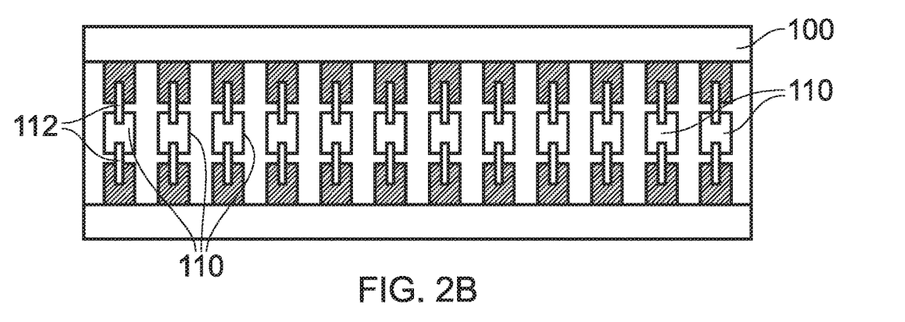
FIG. 2B illustrates a plan view of a carrier with semiconductor dies arranged in the cavity and bonded to the electrical contacts.
Figure 2C:
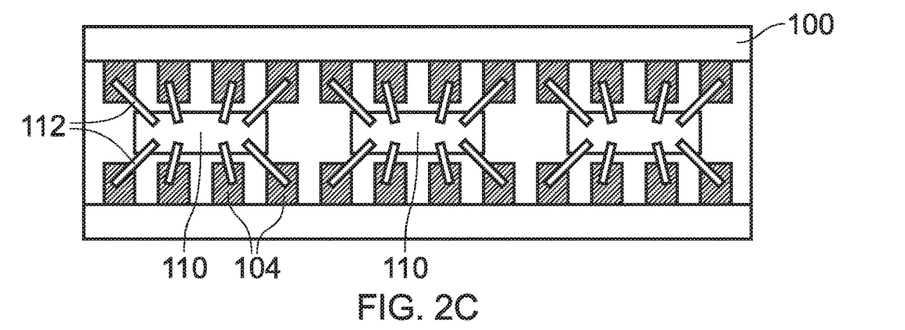
FIG. 2C illustrates a plan view of a carrier with semiconductor dies arranged in the cavity and bonded to the electrical contacts.
Figure 2D:
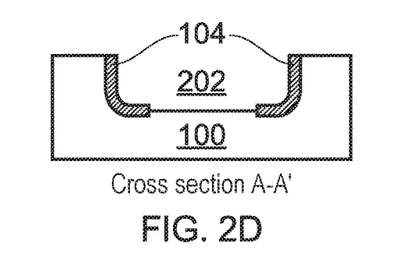
FIG. 2D illustrates a cross-sectional view through line A-A' of FIG. 2A.

As shown in FIG. 2B the semiconductor dies 110 such as a two terminal device may be placed between pairs of opposing electrical contacts 104. Electrical connections 112 such as wire bonds may then connect bond pads of each terminal of the semiconductor dies 110 to the respective opposing electrical contacts 104. In an alternative arrangement shown in FIG. 2C, the semiconductor dies 110 with three or more terminals may be placed between two or more pairs of opposing electrical contacts 104 and electrical connections 112 such as wire bonds may then connect bond pads of each terminal of the semiconductor dies 110 to the respective opposing electrical contacts 104. The arrangements of FIGS. 2B and 2C show two examples of possible connection schemes and the skilled person will understand that other arrangements are possible within the scope of the embodiments presented.

Figure 3A:
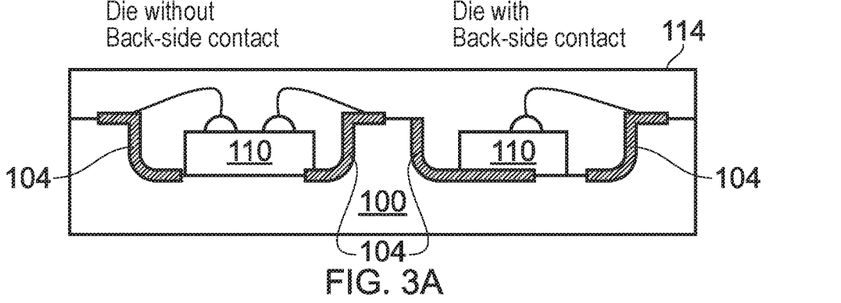
FIG. 3A illustrates a cross-sectional view of a carrier with encapsulated semiconductor dies arranged in the cavities.
Figure 3B:
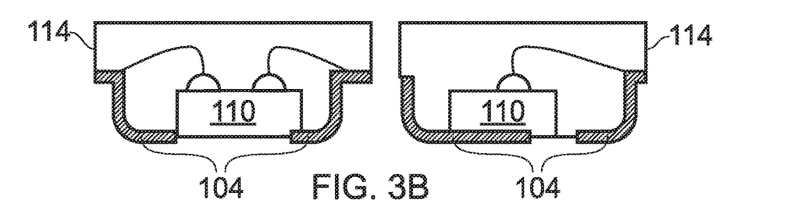
FIG. 3B illustrates a cross-sectional view of a wafer level chip scale semiconductor package according to an embodiment.

An alternative arrangement for connecting bond pads on a top surface of the semiconductor die 110 to the electrical contacts 104 is illustrated in FIGS. 3A and 3B. Rather than connect the bond pads on a top surface of the semiconductor die 110 to the electrical contacts 104 formed on the base of the cavity, as illustrated in FIG. 1C, the electrical connections 112 may be made to an extension of the electrical contacts 104 formed on an upper surface of the carrier 100. In this way it may be easier to wire bond the electrical connection to the electrical contacts 104 since it is not necessary to wire bond in the cavity. This also allows for the width of the cavity to be reduced (or the size of the device to be increased) with respect to the cavity width thereby reducing the footprint of the wafer level chip scale package.

Following electrical connection of the semiconductor dies 110 in the cavities an encapsulant 114 may be deposited over the carrier 100 and processing may continue as discussed above with respect to FIGS. 1C to 1F.

The above embodiments illustrate electrical connections such as wire bonds which may connect bond pads of each terminal of a semiconductor die 110 to the respective opposing electrical contacts 104. Where the semiconductor die 110 comprises a back side contact and a top side contact the back side contact may be attached to one of the electrical contacts by a conductive die attach material.

Figure 4A:
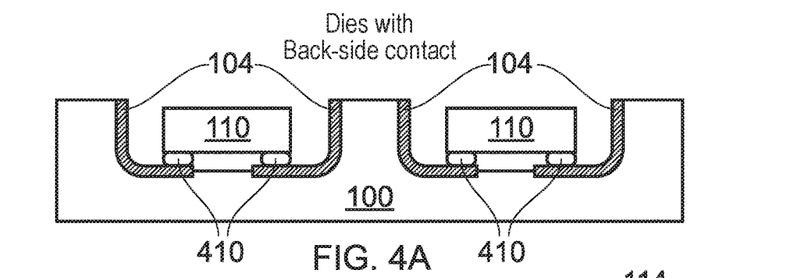
FIG. 4A illustrates a cross-sectional view of a carrier with semiconductor dies arranged in the cavities.

In the embodiment of FIGS. 4A to 4E, the semiconductor die 110 may comprise either top-side contacts only or back side contacts only. As illustrated in FIG. 4A, in the case of back side contacts, solder bumps 410 may be attached to the back side contacts. The die is then placed in the cavity of the carrier 100 such that the solder bumps 410 contact the electrical contacts 104. A solder reflow process may then be carried out and the semiconductor die 110 is attached to the electrical contacts 104 on the carrier 100. Also as illustrated in FIG. 4A, in the case of top-side contacts, solder bumps 410 may be attached to the top-side contacts. The semiconductor die 110 may then be flipped (so-called flip-chip) and placed in the cavity 102 of the carrier 100 such that the solder bumps 410 contact the electrical contacts 104. A solder reflow process may then be carried out and the semiconductor die 110 is attached to the electrical contacts 104 on the carrier 100. Known methods such as "thermocompression bonding" or "bump bonding" can be used to attach the bond pads of the semiconductor die to the electrical contacts. In any case whatever bonding process is used the bond should be formed such that it does not melt or degrade when the final wafer level chips scale package is attached to a printed circuit board during a board mounting process.

Figure 4B:
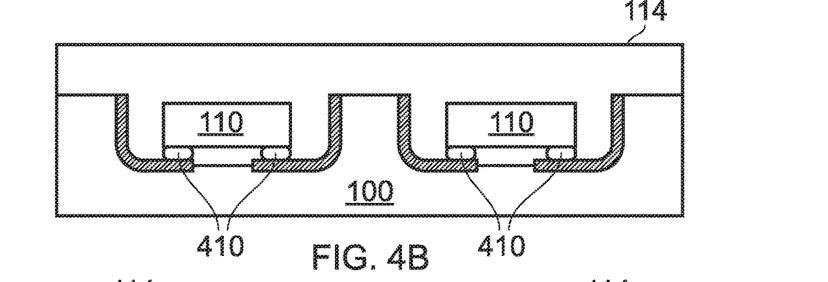
FIG. 4B illustrates a cross-sectional view of a carrier with encapsulated semiconductor dies arranged in the cavities.
Figure 4C:
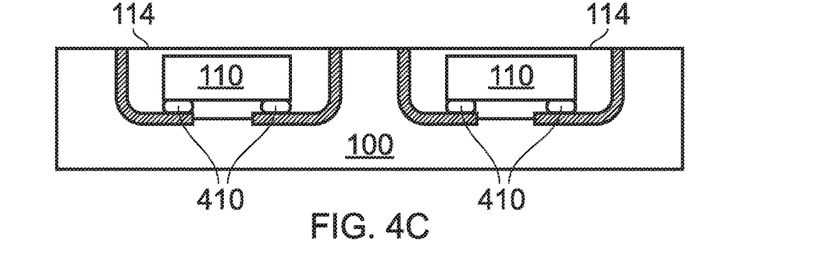
FIG. 4C illustrates the wafer level chips scale package following optional grinding of the encapsulation to the carrier.
Figure 4D:
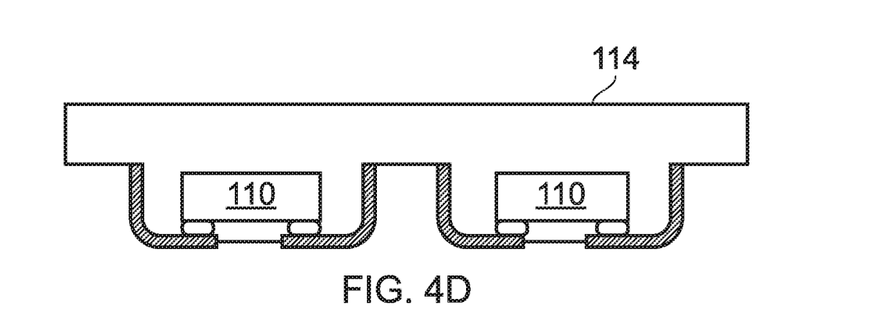
FIG. 4D illustrates a cross-sectional view encapsulated semiconductor dies following removal of the carrier.
Figure 4E:
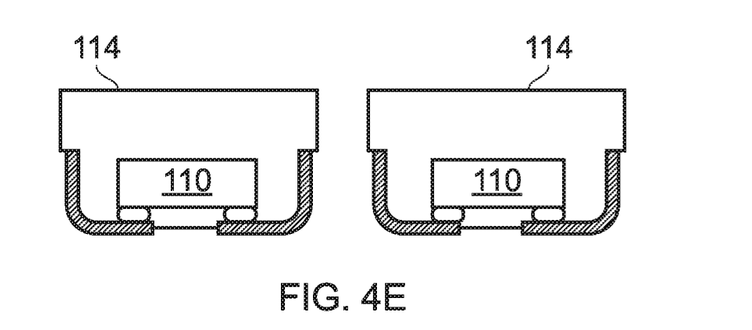
FIG. 4E illustrates a cross-sectional view encapsulated semiconductor dies following singulation.
Figure 4F:
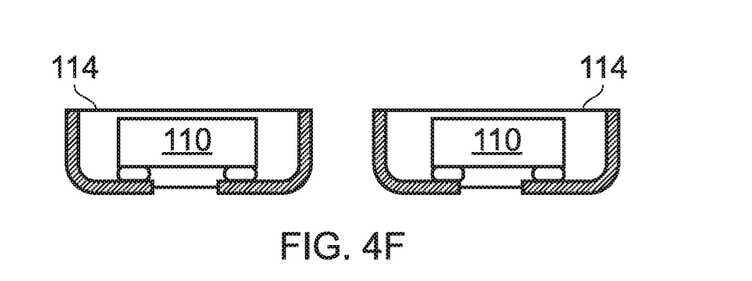
FIG. 4F illustrates the wafer level chips scale package following grinding of the encapsulation.

Following placement and electrical connection of the semiconductor dies 110 in the cavity an encapsulant 114 may be deposited over the carrier 100, as illustrated in FIG. 4B so as to fill the cavity with encapsulant and cover the semiconductor dies 110 and electrical connections 112. The deposition of encapsulation may be an over moulding process for example. Following encapsulation, and as illustrated in FIG. 4C, any excess encapsulation may optionally be removed by grinding back as required to achieve the appropriate wafer level chip scale semiconductor package height. The encapsulant may optionally be ground back until the carrier at the top of the cavity is exposed. In this way the carrier 100 may act as a marker to terminate the grinding process Following the encapsulation and optional grinding, the carrier 100 may be removed as illustrated in FIG. 4D. For example the carrier may be removed by any appropriate etching process such as wet etching, anisotropic, wet etching or plasma etching. In this way the carrier may be seen as a sacrificial carrier. Removal of the carrier thus exposes the electrical contacts 104 which are ultimately contact terminals of the wafer level chip scale semiconductor package. Optionally and as illustrated in FIG. 4D, grinding of the encapsulation 114 may be delayed until later in the process. The wafer level chip scale semiconductor packages may then be singulated as illustrated in FIG. 4E by plasma dicing or using a sawblade. Grinding of any excess encapsulation may complete the process as illustrated in FIG. 4F.

After removal of the carrier, individual wafer level chip scale semiconductor packages may be singulated by sawing or plasma dicing through the encapsulation layer thus arriving at individual packages as illustrated in FIG. 4E.

In the case where the encapsulant is ground back until the carrier at the top of the cavity is exposed, it will not be necessary carry out a separate singulation step because removal of the carrier 100 which attaches adjacent devices will result in singulation of the adjacent devices. In this way the method presented is self-singulating.

Processing in this way achieves a final wafer level chip scale semiconductor package without a carrier or leadframe, thus reducing overall package height. In addition to reduced package height, the electrical contacts 104 form side wettable terminals wafer level chip scale semiconductor package which are capable of visual inspection when the package is soldered or mounted on for example a PCB. Without the side wettable terminals visual inspection is difficult because the terminals will be obscured by the device itself. In this way quality control inspections of mounted devices can be simplified. Furthermore, because of the moulding process, the semiconductor die will be encapsulated and thus better protected from environmental conditions, unlike traditional wafer level chip-scale packages.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed:

1. A method of forming a wafer level chip scale semiconductor package, the method comprising:
   providing a carrier having a cavity formed therein;
   forming electrical contacts at a base portion and sidewalls portions of the cavity, wherein forming the electrical contacts comprises plating the base, the sidewalls of the cavity, and an upper major surface of the carrier;
   placing a semiconductor die in the base of the cavity;
   connecting bond pads of the semiconductor die to the electrical contacts by wire bonding at least one bond pad of the bond pads to at least one electrical contact of the electrical contacts at the upper major surface of the carrier;
   encapsulating the semiconductor die; and
   removing the carrier to expose the electrical contacts, such that the electrical contacts are arranged directly on the encapsulation material.

2. The method of claim 1, wherein the carrier is removed by etching.

3. The method of claim 1, wherein the electrical contacts are formed by a rough plating process.

4. The method of claim 1, wherein the electrical contacts comprise nickel.

5. The method of claim 1, wherein the electrical contacts form the terminals wafer level chip scale semiconductor package.

6. A wafer level chip scale semiconductor package comprising:
   a semiconductor die encapsulated in an encapsulation material, said encapsulation having side walls and base and forming a lip at a top of the side walls away from the base;
   a plurality of electrical contacts, wherein each of the plurality of electrical contacts are arranged directly on the encapsulation material; and
   bond pads of the semiconductor die are connected to respective electrical contacts, wherein said each of said electrical contacts extend from a base portion to a side wall portion and on the lip of the encapsulation material, at least a bond pad of the bond pads is connected by wire bond to at least one electrical contact of the electrical contacts at the lip of the encapsulant;
   wherein the electrical contacts are rough plated.

7. The wafer level chip scale semiconductor package of claim 6 wherein the electrical contacts comprise nickel.

8. The wafer level chip scale semiconductor package of claim 6, wherein the electrical contacts form the terminals wafer level chip scale semiconductor package.

9. The method of claim 1, wherein connecting the bond pads includes wire bonding the bond pads of the semiconductor die to the electrical contacts.

10. The method of claim 1, wherein connecting the bond pads includes bonding at least one bond pad of the bond pads of the semiconductor die to at least one electrical contact of the electrical contacts using solder bumps.

11. The method of claim 1, wherein placing the semiconductor die in the base on the cavity includes placing the semiconductor die to contact at least one of the electrical contacts with a bottom surface of the semiconductor die.

12. The method of claim 11, wherein at least one other electrical contact of the electrical contacts does not contact the bottom of the semiconductor die.

13. The method of claim 1, wherein at least two of the electrical contacts formed at the based and sidewalls portions of the cavity are electrically isolated from each other.

14. The method of claim 1, wherein the carrier is formed of a plastic.

15. The method of claim 1, wherein the carrier is formed of copper or aluminum.

16. The method of claim 1, wherein the electrical contacts include silver or copper.

17. The method of claim 1, wherein the electrical contacts include an alloy comprising gold, nickel, or palladium.

18. The wafer level chip scale semiconductor package of claim 6, wherein at least some of the bond pads are connected to respective electrical contacts using solder bumps.

19. The method of claim 1, wherein placing the semiconductor die in the base on the cavity includes placing the semiconductor die to directly contact the carrier.

20. The method of claim 1, wherein encapsulating the semiconductor die includes encapsulating to extend above the cavity and over the upper major surface of the carrier.

* * * * *